(12) United States Patent  
Kou et al.

(10) Patent No.: US 8,996,954 B2  
(45) Date of Patent: *Mar. 31, 2015

(54) DEFECT SCAN AND MANUFACTURE TEST

(71) Applicant: SK hynix memory solutions inc., San Jose, CA (US)

(72) Inventors: Yu Kou, San Jose, CA (US); Lingqi Zeng, Turlock, CA (US)

(73) Assignee: SK hynix memory solutions inc., San Jose, CA (US)

( * ) Notice: Subject to any disclaimer, the term of this patent is extended or adjusted under 35 U.S.C. 154(b) by 6 days.

This patent is subject to a terminal disclaimer.

(21) Appl. No.: 14/054,662

(22) Filed: Oct. 15, 2013

(65) Prior Publication Data

US 2014/0143616 A1 May 22, 2014

Related U.S. Application Data

(63) Continuation of application No. 13/076,259, filed on Mar. 30, 2011, now Pat. No. 8,589,760.

(60) Provisional application No. 61/341,546, filed on Mar. 31, 2010.

(51) Int. Cl.
| | |
|---|---|
| *G11C 29/00* | (2006.01) |
| *G11C 29/42* | (2006.01) |
| *G11C 29/32* | (2006.01) |
| *G11C 29/44* | (2006.01) |
| *G06F 11/07* | (2006.01) |
| *H03M 13/11* | (2006.01) |

(52) U.S. Cl.
CPC ............... *G11C 29/42* (2013.01); *G11C 29/32* (2013.01); *G11C 29/44* (2013.01); *G06F 11/076* (2013.01); *H03M 13/1102* (2013.01)
USPC ....................................................... 714/763

(58) Field of Classification Search
CPC ............ G06F 11/1076; G06F 11/1008; G06F 11/1068; G06F 11/1044; H05K 999/99
USPC ........................................................... 714/763
See application file for complete search history.

(56) References Cited

U.S. PATENT DOCUMENTS

| | | | |
|---|---|---|---|
| 5,841,667 A * | 11/1998 | Martin ........................... | 702/182 |
| 8,510,633 B2 * | 8/2013 | Sakimura et al. ............. | 714/765 |
| 2003/0105997 A1* | 6/2003 | Mitlin et al. .................. | 714/708 |
| 2005/0276113 A1* | 12/2005 | Nakayama et al. ....... | 365/185.22 |
| 2007/0003135 A1* | 1/2007 | Mattausch et al. ............ | 382/159 |
| 2007/0147489 A1* | 6/2007 | Sun et al. ...................... | 375/231 |
| 2008/0005706 A1* | 1/2008 | Sharma et al. ...................... | 716/4 |
| 2010/0199149 A1* | 8/2010 | Weingarten et al. .......... | 714/773 |
| 2010/0332950 A1* | 12/2010 | Billing et al. ................. | 714/768 |
| 2011/0035634 A1* | 2/2011 | Blaum et al. .................. | 714/704 |
| 2013/0232389 A1* | 9/2013 | Varnica et al. ................ | 714/752 |

* cited by examiner

*Primary Examiner* — Mujtaba K Chaudry  
*Assistant Examiner* — Enam Ahmed  
(74) *Attorney, Agent, or Firm* — Van Pelt, Yi & James LLP

(57) ABSTRACT

A method for detecting a defect in a portion of a storage device is disclosed. Reference data and data read from the portion are compared to determine a number of error bits and a number of error symbols. An error ratio is computed, wherein the error ratio comprises a ratio of the number of error bits to the number of error symbols. A defect is detected based on whether the error ratio exceeds a threshold. In some embodiments, the reference data and the read data are compared to determine an error vector, wherein a bit in the error vector with a value one indicates a bit error in the read data. For each of a plurality of windows of the error vector, a corresponding number of error bits is determined. A defect is detected based on whether any of the numbers of error bits exceeds a threshold.

19 Claims, 6 Drawing Sheets x = [0 1 1 1 0 0 0 1 1 1 1 0 1 0 1 1 1 0 1 0 0 1 0 0 1 1 0 1 1 0 0 1 1 0 0 0 1 0 0...]

y = [0 1 1 0 1 0 1 1 1 0 0 0 0 0 1 0 0 0 1 1 1 1 0 1 0 1 1 1 1 0 1 1 0 1 0 1 0 0...]

⎧ 1st Window ⎫ ⎧ 2nd Window ⎫ ⎧ 3rd Window ⎫ e = [0 0 0 1 1 0 0 0 0 0 1 0 1 1 0 0 1 0 1 0 1 0 1 1 1 0 1 1 1 1 0 0 1 0 0 0 0 1 0 0 0 0...]

FIG. 6

DEFECT SCAN AND MANUFACTURE TEST

CROSS REFERENCE TO OTHER APPLICATIONS

This application is a continuation of co-pending U.S. patent application Ser. No. 13/076,259, entitled DEFECT SCAN AND MANUFACTURE TEST filed Mar. 30, 2011 which is incorporated herein by reference for all purposes, which claims priority to U.S. Provisional Patent Application No. 61/341,546 entitled DEFECT SCAN AND MANUFACTURE TEST filed Mar. 31, 2010 which is incorporated herein by reference for all purposes.

BACKGROUND OF THE INVENTION

Low-density parity-check (LDPC) codes are a type of error correcting code. LDPC codes are becoming increasingly popular for encoding data that is written to storage media, such as hard disk drives or flash drives. It would be desirable to develop testing techniques for LDPC storage applications.

BRIEF DESCRIPTION OF THE DRAWINGS

Various embodiments of the invention are disclosed in the following detailed description and the accompanying drawings.

FIG. 6 is a diagram illustrating a set of reference data (x) for a sector, a set of data read from the sector (y), and an error vector (e) in which a 1 indicates that the particular bit position has a bit error.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

In various embodiments, the techniques described herein are implemented in a variety of systems or forms. In some embodiments, the techniques are implemented in hardware as an application-specific integrated circuit (ASIC) or a field-programmable gate array (FPGA). In some embodiments, a processor (e.g., an embedded one such as an ARM core) is used where the processor is provided or loaded with instructions to perform the techniques described herein. In some embodiments, the technique is implemented as a computer program product which is embodied in a computer readable storage medium and comprises computer instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
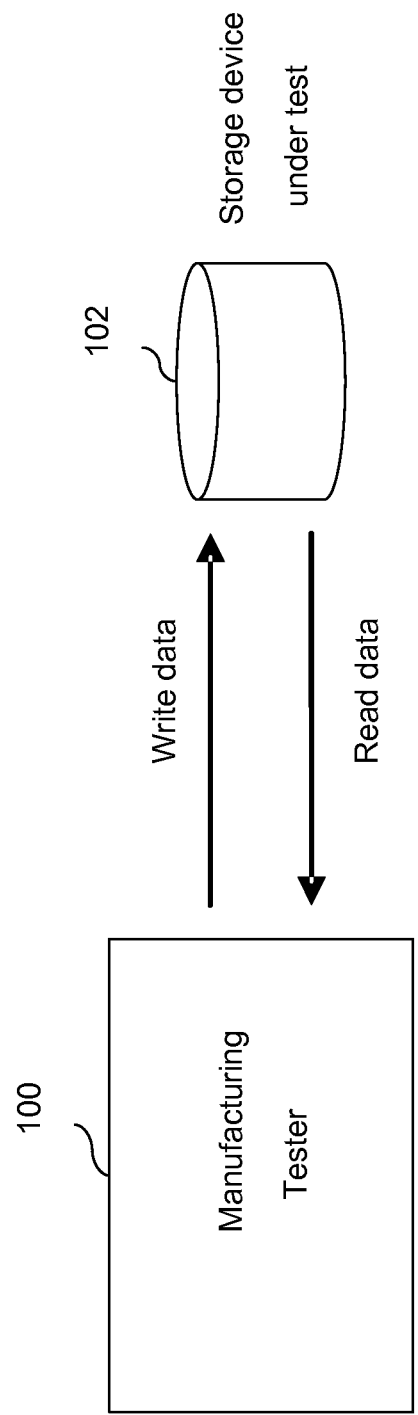
FIG. 1 is a block diagram illustrating an embodiment of a manufacturing test system.

FIG. 1 is a block diagram illustrating an embodiment of a manufacturing test system. Manufacturing tester 100 is configured to test a storage device 102 by writing data to storage device 102, reading the data back from storage device 102, and determining whether storage device 102 meets a certain level of quality such that storage device 102 may be shipped as a product and/or integrated into a larger system. In various embodiments, storage device 102 comprises various types of media. Some examples of storage media include a hard disk drive (HDD) and a flash drive.

Storage device 102 may have different types of defects. For example, storage device 102 may have "stuck-at" faults. Other types of defects include amplitude dropout defects and permanently polarized media defects. In amplitude dropout defects, some portions of storage device 102 have reduced amplitudes. In permanently polarized media defects, some portions of storage device 102 always read back the same value (i.e., they are "permanently" polarized to a value). A defect usually causes the signal read from storage device 102 to have a greater number of errors, which are not always correctable by an error-correcting code (ECC).

Defects of storage device 102 can grow in size and severity after storage device 102 is deployed in the field. For example, imperfections in a hard drive media coating may be caused by the manufacturing process or collisions of the read/write head with the hard drive media. These imperfections can become longer and deeper as storage device 102 is being used in the field. Thus, these growing defects will cause the performance of storage device 102 to degrade over time.

Therefore, even if storage device 102 is deemed to have an acceptable level of quality during manufacturing testing, the performance of storage device 102 may degrade to an unacceptable level of quality over time. To ensure that storage device 102 maintains an acceptable level of quality over its lifetime, storage device 102 must meet the deemed acceptable level of quality with a degree of margin during manufacturing testing. This process is referred to as margining.

One type of manufacturing test is a defect scan. Typically, storage device 102 comprises a plurality of sectors, wherein each sector is a subdivision of a track on storage device 102 and stores a fixed amount of user data. During a defect scan, the "bad" sectors are located; these sectors are masked out and not used. After masking out these sectors, if the remaining sectors still have sufficient storage space to meet the target capacity, then storage device 102 can be shipped as a product and/or integrated into a larger system. A well-designed defect scan should leave enough margin for growing defects. In particular, it should mask out not only the sectors with the more severe defects, but also those with less severe defects that may grow over time and turn into defects that cause the level of quality of the sectors to fall below an acceptable level.

Traditionally, a Reed-Solomon (RS) code is used as an ECC for correcting errors in the signal read back from storage device 102. Reed-Solomon usually uses a bounded distance decoding algorithm. Thus, it is capable of correcting up to T error bits within a sector, where T indicates the correction capability of a Reed-Solomon code.

Figure 2:
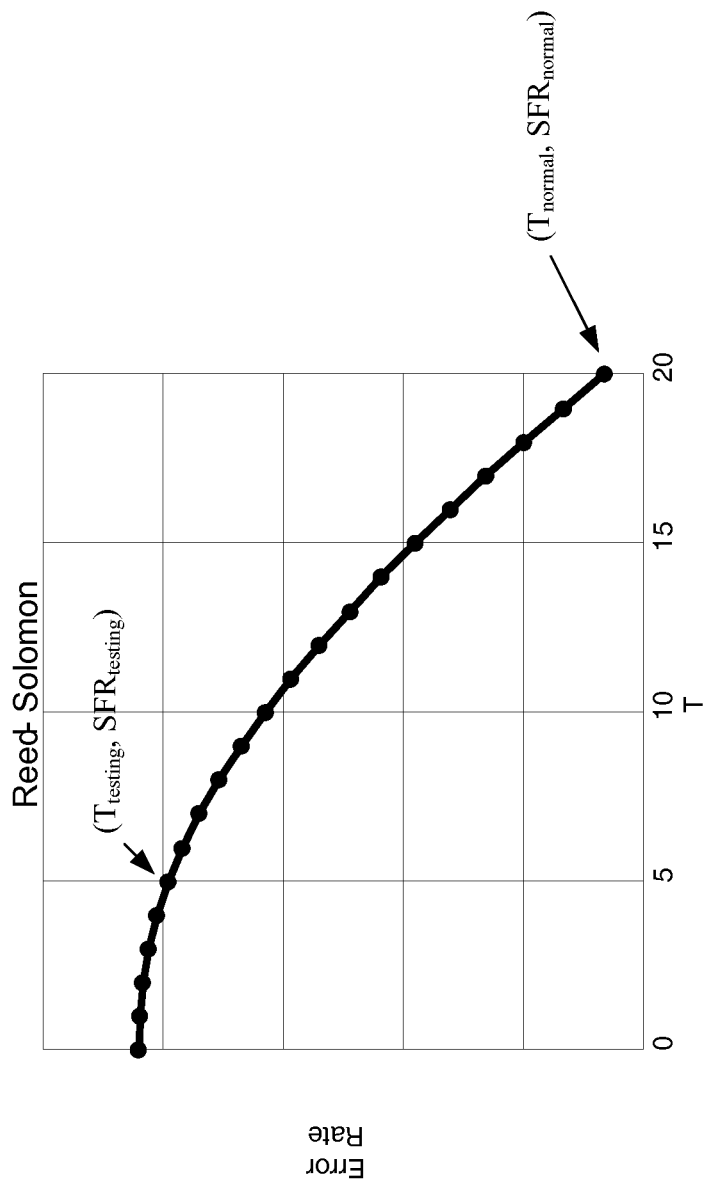
FIG. 2 is a diagram illustrating an exemplary plot of T versus error rate for a Reed-Solomon code.

FIG. 2 is a diagram illustrating an exemplary plot of T versus error rate for a Reed-Solomon code; such a plot is also referred to as an error rate function. As shown in FIG. 2, as T increases, the correction power increases, and the error rate tends to decrease. In some embodiments, the error rate may be specified as a sector failure rate (SFR): the SFR is the probability that the errors of a sector are no longer correctable by the Reed-Solomon code. In some other embodiments, error rate units other than SFR may be used.

To leave enough margins for growing defects, the value of T used for testing storage device 102 ($T_{testing}$) is smaller than the value of T used during the normal operation of storage device 102 ($T_{normal}$). During testing, any sectors that cannot be decoded using $T_{testing}$ are masked out as defective sectors and not used. Since the remaining sectors can be decoded despite a reduced correction power corresponding to $T_{testing}$, the extra correction power reserved for the normal operation of storage device 102 can be used to handle the growing defects. Thus, margining can be achieved.

Recently, low-density parity-check (LDPC) codes are replacing Reed-Solomon codes as the preferred ECC for storage devices. Designing manufacturing tests for storage devices using LDPC codes is challenging for a number of reasons.

LDPC codes use a probability based decoding algorithm called the message passing decoding algorithm. One of the parameters associated with the message passing decoding algorithm is the number of LDPC iterations. As the number of LDPC iterations increases, the performance of the message passing decoding algorithm also increases.

Figure 3:
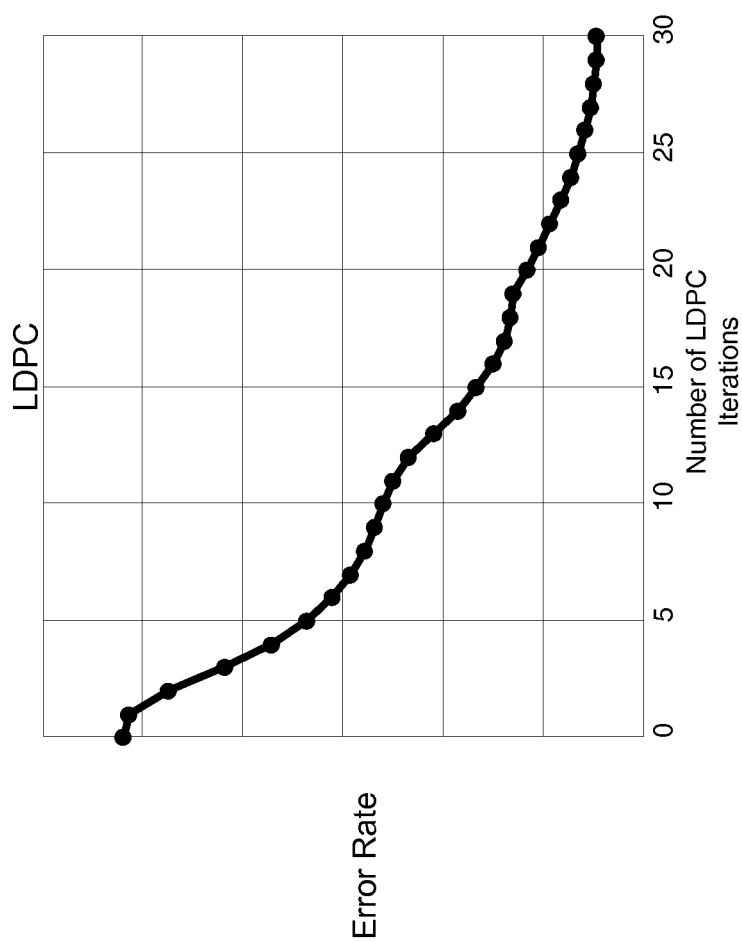
FIG. 3 is a diagram illustrating an exemplary plot of the number of LDPC iterations versus error rate.

FIG. 3 is a diagram illustrating an exemplary plot of the number of LDPC iterations versus error rate. The plot is an error rate function for an LDPC code. As the number of LDPC iterations increases, the correction power of the LDPC code increases, and the error rate of the LDPC code tends to decrease. To leave margin for growing defects, the number of LDPC iterations used for testing storage device 102 ($N_{testing}$) can be selected to be smaller than the number of LDPC iterations used during the normal operation of storage device 102 ($N_{normal}$). During testing, any sectors that cannot be decoded using $N_{testing}$ are masked out as defective sectors and not used. Since the remaining sectors can be decoded despite a reduced error correction power (corresponding to $N_{testing}$), the extra correction power reserved for the normal operation of storage device 102 will have a margin for handling growing defects.

However, unlike Reed-Solomon codes, a LDPC code does not use a bounded distance decoding algorithm. For example, a sector with 100 bit errors may be easily decoded by an LDPC decoder, whereas another sector with only 50 bit errors may not be decoded. Therefore, it may be difficult to determine whether a tested sector is close to failure and whether the reserved margin is sufficient to handle the growing defects once the device is being used in the field.

Furthermore, in general, defects have a less predictable and bigger impact on the performance of LDPC codes than Reed-Solomon codes. This is because the statistical properties for the bits in a defect region are very different from the statistical properties assumed by the message passing decoding algorithm for the bits in normal regions. Therefore, a growing defect in a sector can quickly use up the entire reserved margin and render the sector undecodable. Therefore, a reliable method for detecting defects in a sector is desirable.

In some embodiments, an error ratio (ER) of the number of error bits to the number of error symbols is used to determine whether a defect exists in a sector or region. The error ratio is defined by the following equation:

$$ER = \frac{\text{\# of error bits}}{\text{\# of error symbols}} \quad (1)$$

where an error bit is any bit in a sector that is in error, and an error symbol is any symbol in a sector that has one or more bits in error.

For example, suppose a sector of storage device 102 has 5000 bits. A symbol is defined as a set of continuous bits, e.g., 10 continuous bits. In this example, a sector with 5000 bits has 500 symbols (i.e., 5000 bits divided by 10 bits/symbol equals 500 symbols). Among the 500 symbols, if two of the symbols are in error, with one symbol having one bit error and the other symbol having two bit errors, then the error ratio based on equation (1) above is:

$$ER = \frac{(1+2)}{2} = \frac{3}{2} = 1.5$$

Typically, in a substantially defect-free region, 90% of the errors are either single-bit errors (e.g., 50%), di-bit errors (e.g., 30%), or tri-bit errors (e.g., 10%). There is a single-bit error when the bit right before and the bit right after an error bit are both correct; there is a di-bit error when two and only two continuous bits are in error, and there is a tri-bit error when three and only three continuous bits are in error.

Since the errors in a defect-free region are dominated by the three types of error events described above (especially the single-bit errors), most error symbols have one, two, or three error bits only. Therefore, on average, the error ratio has a value between one and two.

In contrast, in a defect region, the errors bits tend to concentrate together, and a symbol often has half of its bits in error. For example, a symbol with 10 continuous bits may have 5 bits in error. In this case, the error ratio is equal to 5

$$\left(i.e., ER = \frac{5 \text{ error bits}}{1 \text{ error symbol}} = 5\right).$$

Since the average error ratio for a defect region is greater than that for a defect-free region, an error ratio computed for a sector can be used to determine whether a defect exists in the sector. For example, if the error ratio for a sector is greater than a threshold, then the sector is determined as having a defect; otherwise, the sector is determined as having no defects. In some embodiments, the threshold is a value between 2 and 5. For example, the threshold may be set at 2.5.

Thus, a defect test for storage device 102 can be as follows:

$$ER = \frac{\text{\# of error bits}}{\text{\# of error symbols}} > Threshold_1 \quad (2)$$

In some embodiments, multiple values of $Threshold_1$ may be used for detecting defects within a sector at different confidence levels. For example, if $Threshold_1$ is set to 3, then a defect detected by equation (2) is more certain to be a defect than if $Threshold_1$ is set to 2.5.

However, the defect test described above (equation (2)) may cause false alarms in some cases. For example, if only one symbol within a sector has an error and the symbol has only two tri-bit errors, then the error ratio is:

$$ER = \frac{2 * 3 \text{ bits}}{1 \text{ symbol}} = 6$$

which is greater than a threshold of 2.5, for example. As explained above, having tri-bit errors in a sector is not an indication that a defect exists in the sector. Furthermore, a sector with a defect usually has a greater total number of error bits. Therefore, the defect test described in equation (2) above may cause a false alarm in this case.

Accordingly, the defect test as shown in equation (2) may be modified as follows:

$$\left(ER = \frac{\text{\# of error bits}}{\text{\# of error symbols}} > Threshold_1\right) \text{ and} \quad (3)$$

$$(\text{\# of error bits} > Threshold_2)$$

In some embodiments, $Threshold_2$ in equation (3) above is a minimum number of error bits that needs to be observed within a sector before a defect is detected in the sector. For example, $Threshold_2$ can be set to 50. When a sufficient number of error bits are observed within a sector, the error ratio will be averaged out because the error events will include some single-bit errors, di-bit errors, and tri-bit errors. Accordingly, the chance of having false alarms will be reduced.

In general, $Threshold_2$ should be high enough to provide a sufficient number of data points for calculating the error ratio for the sector. $Threshold_2$ may also be determined based on the number of error bits that can be corrected by the LDPC code. For example, if the LDPC code can easily correct k bits in a sector, then $Threshold_2$ should be set to a value at least higher than k bits. Otherwise, many sectors may be masked out as "bad" sectors when in fact they can maintain an acceptable level of quality in the field.

As an illustrative example only, consider a sector with a defect that is 100 bits long. As mentioned above, within a defect, half or more of the bits may be wrong. Suppose the defect has 50 bits in error and these 50 bits are distributed over 10 error symbols $$\left(i.e., \frac{100 \text{ bits}}{10 \text{ bits/symbol}} = 10\right).$$

Assuming that the sector has additional 50 random errors distributed over 25 error symbols, then the error ratio for the sector is:

$$ER = \frac{50 \text{ error bits in defect} + 50 \text{ random error bits}}{10 \text{ error symbols in defect} + 25 \text{ error symbols}} \cong 2.857 > 2.5$$

With $Threshold_2$ set to 50, the total number of error bits (100 bits) within the sector exceeds $Threshold_2$, and therefore a defect is detected in the sector according to equation (3).

Figure 4:
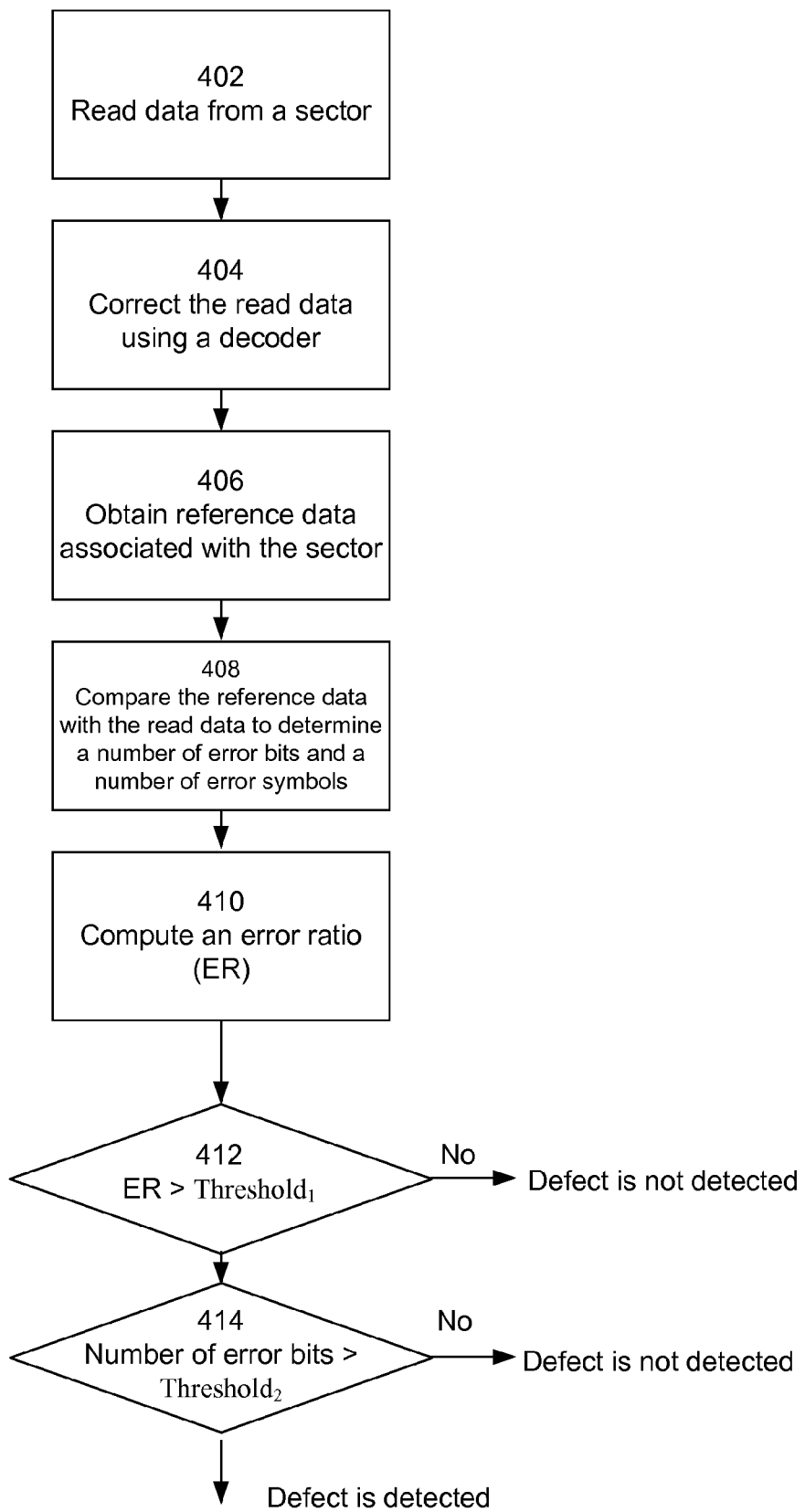
FIG. 4 is a flowchart illustrating an embodiment of a process 400 for detecting a defect in a sector.

FIG. 4 is a flowchart illustrating an embodiment of a process 400 for detecting a defect in a sector. At 402, data is read from a sector of storage device 102. At 404, the data read from the sector is decoded and corrected using a decoder. In some embodiments, the decoder is an LDPC decoder. At 406, a set of reference data associated with the sector is obtained. In some embodiments, the set of reference data is a known data pattern that was written to the sector. In some embodiments, the set of reference data is the decoded and corrected data obtained from the LDPC decoder. At 408, the set of reference data is compared with the data read from the sector. By comparing bit by bit the two sets of data, the number of error bits, the positions of the error bits, and the number of error symbols can be determined. At 410, an error ratio (ER) is computed according to equation (1) above. At 412, the computed error ratio is compared with $Threshold_1$ as described above. If the computed error ratio is smaller than or equal to $Threshold_1$, then a defect is not detected in the sector; otherwise, process 400 continues to step 414. At 414, the number of error bits is compared with $Threshold_2$ as described above. If the number of error bits is smaller than or equal to $Threshold_2$, then a defect is not detected in the sector; otherwise, a defect is detected in the sector and the process terminates.

In some embodiments, the order of the steps in process 400 may be different from that shown in FIG. 4. For example, step 414 may be performed prior to step 410. If the number of error bits is greater than $Threshold_2$, then step 410 is performed; otherwise, a defect is not detected in the sector and the process terminates.

Figure 5:
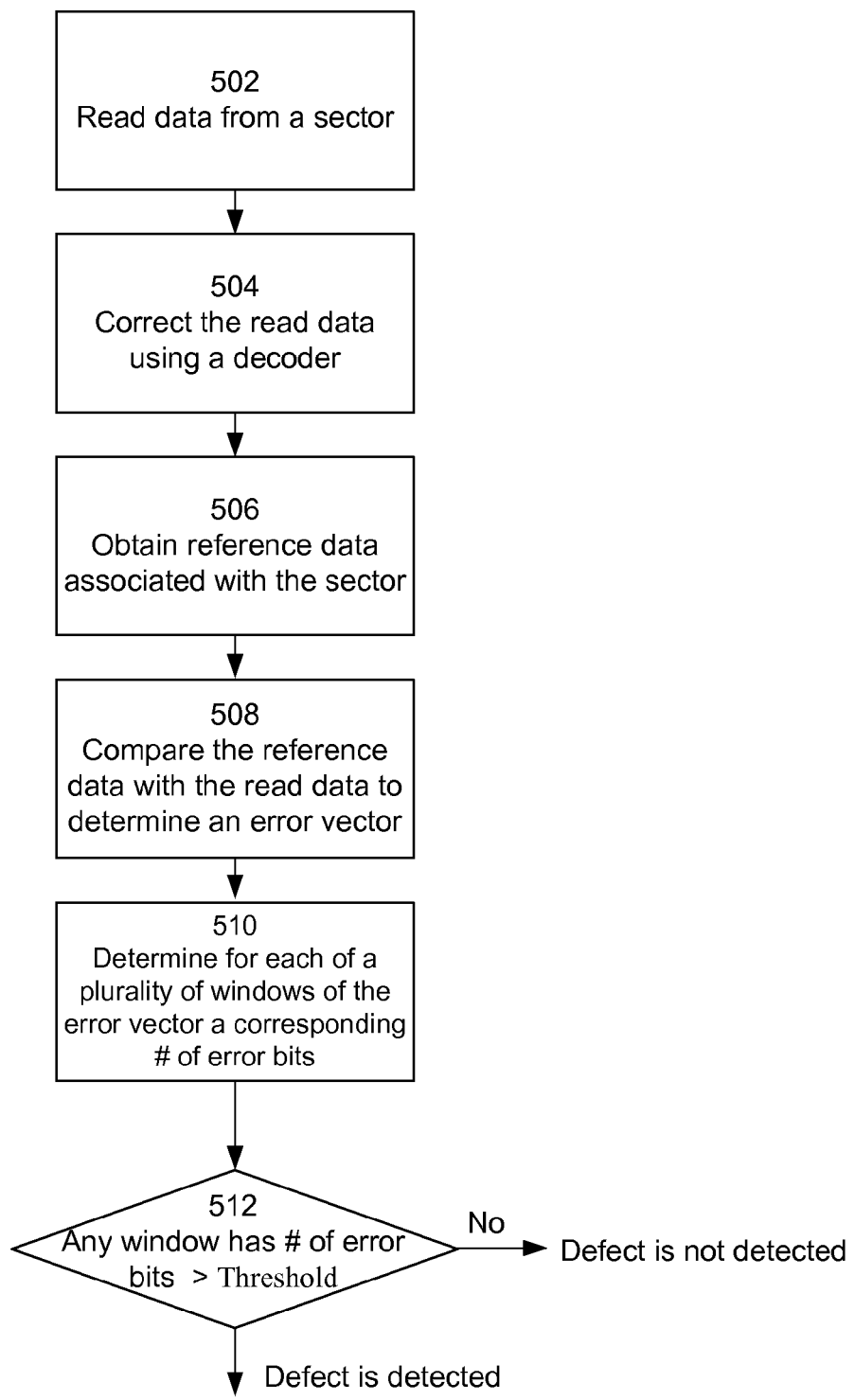
FIG. 5 is a flowchart illustrating an embodiment of a process 500 for detecting a defect in a sector.

In some embodiments, a moving window is used to search for defects in a sector. FIG. 5 is a flowchart illustrating an embodiment of a process 500 for detecting a defect in a sector. At 502, data is read from a sector of storage device 102. At 504, the data read from the sector is decoded and corrected using a decoder. In some embodiments, the decoder is an LDPC decoder. At 506, a set of reference data associated with the sector is obtained. In some embodiments, the set of reference data is a known data pattern that was written to the sector. In some embodiments, the set of reference data is the decoded and corrected data obtained from the LDPC decoder. At 508, the set of reference data is compared with the data read from the sector. By comparing bit by bit the two sets of data, the number of error bits and the positions of the error bits can be determined. For example, FIG. 6 is a diagram illustrating a set of reference data (x) for a sector, a set of data read from the sector (y), and an error vector (e) in which a 1 indicates that the particular bit position has a bit error.

At 510, for each of a plurality of moving windows applied to the error vector, a corresponding number of error bits within the window is determined. For example, as shown in FIG. 6, the first window has 8 error bits, the second window has 11 error bits, and the third window has 8 error bits. The number of bits in each window is called the window size; in the example shown in FIG. 6, the window size is 20. The distance between the beginnings of two consecutive windows is called the window step size, and the window step size in this example is 10. In this example, the windows are overlapping. In some other embodiments, windows can be non-overlapping.

In some embodiments, the window size is determined based on the length of the defects that the test is expected to detect. For example, if a test is designed to detect defects having at least a certain length (in bits), then the window size may be set to the same length.

In some embodiments, the window size may be determined based on the number of error bits that can be corrected by the LDPC code. For example, if the LDPC code can easily correct k bits in a sector, then the window size may be set to a value at least higher than k bits. Otherwise, many sectors may be masked out as "bad" sectors when in fact they can maintain an acceptable level of quality in the field.

At 512, if the number of error bits within any of the moving windows exceeds a threshold, then a defect is detected within the sector; otherwise, a defect is not detected. In some embodiments, the threshold is a percentage of the window size. In the example shown in FIG. 6, the threshold is 10 bits (i.e., 50% of the window size of 20 bits). Since the second window has 11 error bits, which is greater than the threshold of 10 bits, a defect is detected in the second window.

In some embodiments, the defect test defined in equation (3) above (the error ratio defect test) and the defect test as shown in FIG. 5 (the moving window defect test) may be used together to detect defects in a sector. In some embodiments, a sector is masked out and not used if both tests detect a defect within the sector. In some embodiments, a sector is masked out as long as either of the tests detects a defect within the sector.

In some embodiments, the sectors of storage device 102 can be tested by first using other margining techniques. For example, a reduced number of LDPC iterations may be used to test the sectors of storage device 102. Alternatively, the sectors of storage device 102 may be tested based on limiting the total number of error bits within each sector to within a threshold. The sectors that have passed one or more of these margining tests can be further tested using the error ratio defect test and/or the moving window defect test above. The two defect tests will eliminate marginally good sectors, thus ensuring that the sectors that barely pass other margining tests will still be able to maintain an acceptable level of quality in the field.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for determining whether a portion of a storage device includes a defect, comprising:
    a processor configured to:
        read data from the portion of the storage device;
        correct the read data using a decoder;
        obtain reference data associated with the portion;
        compare the reference data and the read data to determine a number of error bits and a number of error symbols associated with the portion;
        compute an error ratio, wherein the error ratio comprises a ratio of the determined number of error bits to the determined number of error symbols; and
        determine whether the portion includes a defect based at least in part on whether the error ratio exceeds a first threshold, wherein the first threshold is selected based at least in art on a first estimated error ratio for a portion of the storage device with a defect, wherein the first estimated error ratio is calculated based on an assumption that half of the bits in a symbol are in error; and
    a communication interface coupled to the processor.

2. The system of claim 1, wherein the decoder is a low-density parity-check (LDPC) decoder.

3. The system of claim 1, wherein the portion of the storage device comprises a sector of the storage device.

4. The system of claim 1, wherein the first threshold is selected based at least in part on a second estimated error ratio for a defect-free portion of the storage device, wherein the second estimated error ratio is calculated based on an assumption that a majority of error events associated with the defect-free portion include single-bit errors, di-bit errors, and tri-bit errors.

5. The system of claim 4, wherein the first threshold is selected to be a value between the first estimated error ratio and the second estimated error ratio.

6. The system of claim 1, wherein the processor is further configured to determine whether the portion includes a defect based at least in part on whether the number of error bits exceeds a second threshold.

7. The system of claim 6, wherein the second threshold is determined based at least in part on an estimate of a number of observable error events.

8. The system of claim 6, wherein the second threshold is determined based at least in part on a correction power of an LDPC decoder used for decoding the data associated with the portion.

9. A method for determining whether a portion of a storage device includes a defect, comprising:
    reading data from the portion of the storage device;
    correcting the read data using a decoder;
    obtaining reference data associated with the portion;
    comparing the reference data and the read data to determine a number of error bits and a number of error symbols associated with the portion;
    computing an error ratio, wherein the error ratio comprises a ratio of the determined number of error bits to the determined number of error symbols; and
    determining whether the portion includes a defect based at least in part on whether the error ratio exceeds a first threshold, wherein the first threshold is selected based at least in part on a first estimated error ratio for a portion of the storage device with a defect, wherein the first estimated error ratio is calculated based on an assumption that half of the bits in a symbol are in error.

10. The method of claim 9, wherein the first threshold is selected based at least in part on a second estimated error ratio for a defect-free portion of the storage device, wherein the second estimated error ratio is calculated based on an assumption that a majority of error events associated with the defect-free portion include single-bit errors, di-bit errors, and tri-bit errors.

11. The method of claim 10, wherein the first threshold is selected to be a value between the first estimated error ratio and the second estimated error ratio.

12. The method of claim 9, further comprising determining whether the portion includes a defect based at least in part on whether the number of error bits exceeds a second threshold.

13. The method of claim 12, wherein the second threshold is determined based at least in part on an estimate of a number of observable error events.

14. The method of claim 12, wherein the second threshold is determined based at least in part on a correction power of an LDPC decoder used for decoding the data associated with the portion.

15. A computer program product for determining whether a portion of a storage device includes a defect, the computer program product being embodied in a non-transitory computer readable storage medium and comprising computer instructions for:
- reading data from the portion of the storage device;
- correcting the read data using a decoder;
- obtaining reference data associated with the portion;
- comparing the reference data and the read data to determine a number of error bits and a number of error symbols associated with the portion;
- computing an error ratio, wherein the error ratio comprises a ratio of the determined number of error bits to the determined number of error symbols; and
- determining whether the portion includes a defect based at least in part on whether the error ratio exceeds a first threshold, wherein the first threshold is selected based at least in part on a first estimated error ratio for a portion of the storage device with a defect, wherein the first estimated error ratio is calculated based on an assumption that half of the bits in a symbol are in error.

16. A system for determining whether a portion of a storage device includes a defect, comprising:
- a processor configured to:
    - read data from the portion of the storage device;
    - correct the read data using a decoder;
    - obtain reference data associated with the portion;
    - compare the reference data and the read data to determine an error vector, wherein a bit in the error vector with a value one indicates a bit error in the read data;
    - determine for each of a plurality of windows of the error vector a corresponding number of error bits, wherein a size of one of the plurality of windows is selected based at least in part on a correction power of an LDPC decoder used for decoding the data associated with the portion; and
    - determine whether the portion includes a defect based at least in part on whether any of the numbers of error bits exceeds a threshold; and
- a communication interface coupled to the processor.

17. The system of claim 16, wherein a size of one of the plurality of windows is selected based at least in part on a length of a defect to be detected.

18. A method for determining whether a portion of a storage device includes a defect, comprising:
- reading data from the portion of the storage device;
- correcting the read data using a decoder;
- obtaining reference data associated with the portion;
- comparing the reference data and the read data to determine an error vector, wherein a bit in the error vector with a value one indicates a bit error in the read data;
- determining for each of a plurality of windows of the error vector a corresponding number of error bits, wherein a size of one of the plurality of windows is selected based at least in part on a correction power of an LDPC decoder used for decoding the data associated with the portion; and
- determining whether the portion includes a defect based at least in part on whether any of the numbers of error bits exceeds a threshold.

19. A computer program product for determining whether a portion of a storage device includes a defect, the computer program product being embodied in a non-transitory computer readable storage medium and comprising computer instructions for:
- reading data from the portion of the storage device;
- correcting the read data using a decoder;
- obtaining reference data associated with the portion;
- comparing the reference data and the read data to determine an error vector, wherein a bit in the error vector with a value one indicates a bit error in the read data;
- determining for each of a plurality of windows of the error vector a corresponding number of error bits, wherein a size of one of the plurality of windows is selected based at least in part on a correction power of an LDPC decoder used for decoding the data associated with the portion; and
- determining whether the portion includes a defect based at least in part on whether any of the numbers of error bits exceeds a threshold.

* * * * *